United States Patent
Hiyama et al.

(10) Patent No.: US 6,992,020 B2
(45) Date of Patent: Jan. 31, 2006

(54) METHOD OF FABRICATING SEMICONDUCTOR DEVICE

(75) Inventors: Susumu Hiyama, Kanagawa (JP); Akihito Yamamoto, Kanagawa (JP); Hiroshi Akahori, Kanagawa (JP); Shigehiko Saida, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/902,414

(22) Filed: Jul. 30, 2004

(65) Prior Publication Data

US 2005/0012171 A1 Jan. 20, 2005

Related U.S. Application Data

(62) Division of application No. 10/235,917, filed on Sep. 6, 2002, now Pat. No. 6,841,850.

(30) Foreign Application Priority Data

Jul. 9, 2002 (JP) ........................................ 2002-200266

(51) Int. Cl.
  H01L 21/31 (2006.01)
  H01L 21/469 (2006.01)

(52) U.S. Cl. ................... 438/763; 438/761; 438/762; 438/778; 438/787; 438/791

(58) Field of Classification Search ......... 438/761–763, 438/778, 787, 791
See application file for complete search history.

(56) References Cited

U.S. PATENT DOCUMENTS

| | | | |
|---|---|---|---|
| 5,523,616 A | * | 6/1996 | Den .......................... 257/637 |
| 6,037,018 A | | 3/2000 | Jang et al. ................... 427/579 |
| 6,133,160 A | | 10/2000 | Komiyama et al. ......... 438/761 |
| 6,228,780 B1 | * | 5/2001 | Kuo et al. ................... 438/763 |
| 6,235,650 B1 | * | 5/2001 | Yao ............................. 438/786 |
| 6,251,795 B1 | * | 6/2001 | Shan et al. ................. 438/723 |
| 6,277,706 B1 | | 8/2001 | Ishikawa ..................... 438/424 |
| 6,319,849 B1 | * | 11/2001 | Oda et al. .................... 438/763 |
| 6,333,547 B1 | | 12/2001 | Tanaka et al. .............. 257/649 |
| 6,407,007 B1 | * | 6/2002 | Tsan et al. ................... 438/763 |
| 6,489,254 B1 | * | 12/2002 | Kelkar et al. ............... 438/778 |
| 6,579,764 B2 | | 6/2003 | Kuwazawa ................. 438/258 |
| 2002/0001917 A1 | | 1/2002 | Park ........................... 438/424 |
| 2002/0076916 A1 | | 6/2002 | Yamashita et al. ......... 438/623 |
| 2002/0197823 A1 | | 12/2002 | Yoo et al. ................... 438/424 |

FOREIGN PATENT DOCUMENTS

| | | |
|---|---|---|
| JP | 2994616 | 10/1999 |
| JP | 2000-349082 | 12/2000 |
| KR | 2002-0002578 | 1/2002 |

OTHER PUBLICATIONS

Notification of Argument Submission mailed on Jan. 24, 2005 by the Korean Patent Office in application No. 10–2003–0045983, and English translation of Notification.

* cited by examiner

*Primary Examiner*—Amir Zarabian
*Assistant Examiner*—Ida M. Soward
(74) *Attorney, Agent, or Firm*—Finnegan, Henderson, Farabow, Garrett & Dunner, L.L.P.

(57) ABSTRACT

A semiconductor device of this invention includes a silicon nitride film formed on a semiconductor substrate and having a density of 2.2 g/cm$^3$ or less, and a silicon oxide film formed on the silicon nitride film in an ambient atmosphere containing TEOS and O$_3$.

12 Claims, 5 Drawing Sheets

US 6,992,020 B2

METHOD OF FABRICATING SEMICONDUCTOR DEVICE

CROSS REFERENCE TO RELATED APPLICATION

This is a division of application Ser. No. 10/235,917, filed Sep. 6, 2002, now U.S. Pat. No. 6,841,850 which is incorporated herein by reference.

BACKGROUND OF THE INVENTION

The present invention relates to a semiconductor device and a method of fabricating the same and, more particularly, to a semiconductor device and a method of fabricating the same preferable when a dielectric interlayer is formed on a gate electrode or when an insulating film is buried in a trench in STI (Shallow Trench Isolation).

After a gate electrode is formed, a silicon oxide ($SiO_2$) film is formed as a dielectric interlayer, or a silicon oxide film is buried in a trench in STI formation.

When a silicon oxide film is formed at a film formation temperature of 500° C. or less in an $O_3$/TEOS ambient atmosphere, a film having flowability, i.e., self-flatness is obtained without any reflow step, so excellent filling characteristics can be obtained.

Unfortunately, a film formation reaction in this case is sometimes very sensitive to and dependent on the surface of an underlayer. Especially when a silicon oxide film is formed on the surface of a silicon nitride (SiN) film, abnormal growth often occurs to form a porous film. This phenomenon is generally called underlayer dependence.

FIG. 11 shows the state of a section when a silicon oxide film is formed in the presence of this underlayer dependence.

An electrode material is deposited on the surface of a semiconductor substrate 10 and patterned to form a gate electrode 11. A silicon nitride film 12 is so formed as to cover the gate electrode 11 and the semiconductor substrate 10. After that, a silicon oxide film 13 as a dielectric interlayer is so formed as to cover the silicon nitride film 12, at a film formation temperature of 500° C. or less in an $O_3$/TEOS ambient atmosphere. Since this silicon oxide film 13 has underlayer dependence, the flowability unique to the $O_3$/TEOS process is lost, and the filling characteristics extremely deteriorate. Consequently, voids 14 are formed in the silicon oxide film 13.

When film formation is performed in an ambient atmosphere at a low $O_3$ concentration, no underlayer dependence is produced. Conventionally, therefore, a method which forms films in two stages is often used. In this method, film formation is performed using low-concentration $O_3$ gas in the initial stage, and then film formation is performed using high-concentration $O_3$ gas.

When films are formed by this method, however, a silicon oxide film as the first layer must have a film thickness of 100 nm or more in order to reduce the underlayer dependence.

Additionally, this silicon oxide film as the first layer formed at a low $O_3$ concentration has poor filling characteristics. In recent microfabricated patterns, trenches are filled with the silicon oxide film as the first layer. This makes the two-stage film formation method difficult to use.

The underlayer dependence can also be eliminated by improving the surface of a silicon nitride film by plasma irradiation. In this case, however, the cost increases because an apparatus for plasma irradiation is additionally required. In addition, the transistor characteristics may deteriorate by plasma damage. Therefore, this method is also difficult to use.

As described above, when a silicon oxide film is formed to fill a portion between gate electrodes or to fill STI in conventional devices, the filling characteristics deteriorate by the underlayer dependence.

SUMMARY OF THE INVENTION

According to an aspect of the present invention, there is provided a semiconductor device comprising a silicon nitride film formed on a semiconductor substrate and having a density of 2.2 g/cm$^3$ or less, and a silicon oxide film formed on the silicon nitride film in an ambient atmosphere containing TEOS and $O_3$.

According to another aspect of the present invention, there is provided a semiconductor device comprising a gate electrode formed on a semiconductor substrate, a silicon nitride film so formed as to cover the gate electrode and having a density of 2.2 g/cm$^3$ or less, and a silicon oxide film formed on the silicon nitride film in an ambient atmosphere containing TEOS and $O_3$.

According to another aspect of the present invention, there is provided a semiconductor device comprising a silicon nitride film so formed as to cover the inner surfaces of a trench formed in the surface of a semiconductor substrate, and having a density of 2.2 g/cm$^3$ or less, and a silicon oxide film formed in an ambient atmosphere containing TEOS and $O_3$ so as to fill the trench covered with the silicon nitride film.

According to another aspect of the present invention, there is provided a semiconductor device fabrication method comprising the steps of forming a silicon nitride film having a density of 2.2 g/cm$^3$ or less on a semiconductor substrate, and forming a silicon oxide film on the silicon nitride film at a film formation temperature of 500° C. or less and a film formation pressure of 200 to 760 Torr in an ambient atmosphere which contains TEOS and $O_3$ and in which the concentration of $O_3$ is 5 wt % or more.

According to an aspect of the present invention, there is provided a semiconductor device fabrication method comprising forming a gate electrode on a semiconductor substrate, forming a silicon nitride film having a density of 2.2 g/cm$^3$ or less so as to cover the gate electrode, and forming a silicon oxide film on the silicon nitride film at a film formation temperature of 500° C. or less and a film formation pressure of 200 to 760 Torr in an ambient atmosphere which contains TEOS and $O_3$ and in which the concentration of $O_3$ is 5 wt % or more.

According to another aspect of the present invention, there is provided a semiconductor device fabrication method comprising forming a trench in the surface of a semiconductor substrate, forming a silicon nitride film having a density of 2.2 g/cm$^3$ or less so as to cover the inner surfaces of the trench, and forming a silicon oxide film on the silicon nitride film at a film formation temperature of 500° C. or less and a film formation pressure of 200 to 760 Torr in an ambient atmosphere which contains TEOS and $O_3$ and in which the concentration of $O_3$ is 5 wt % or more.

DESCRIPTION OF THE EMBODIMENTS

As described above, the underlayer dependence when a silicon oxide film is formed is a problem in conventional devices. The present inventor has found that this dependence is reduced when the film density of an underlying silicon nitride film is low. As explained in the following embodiments, a silicon oxide film is formed on a silicon nitride film having low film density at a film formation temperature of 500° C. in an $O_3$/TEOS ambient, as film formation conditions under which flowability is obtained. In this manner, a silicon oxide film having low underlayer dependence and superior filling performance can be formed.

Embodiments of the present invention made on the basis of the above consideration will be described below with reference to the accompanying drawings.

(1) First Embodiment

Figure 1:
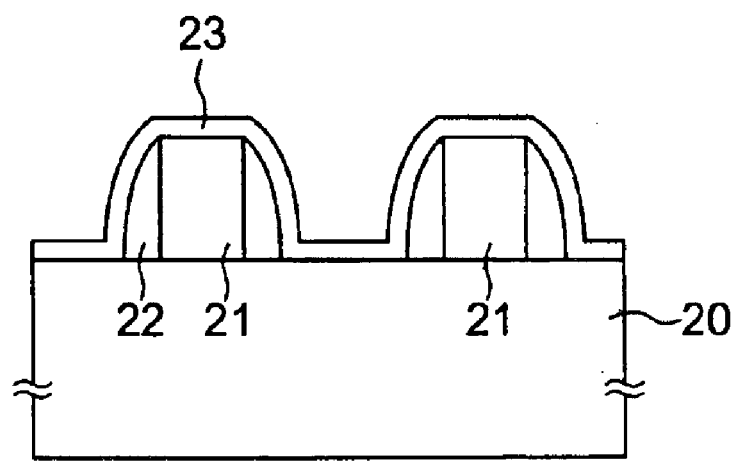
FIG. 1 is a longitudinal sectional view showing the longitudinal section of a semiconductor device according to the first embodiment of the present invention, and showing one step in a method of fabricating the semiconductor device.

The first embodiment of the present invention will be described below with reference to FIG. 1. This embodiment relates to a device in which a silicon oxide film is formed as a dielectric interlayer on a gate electrode.

An electrode material is deposited on the surface of a semiconductor substrate 20 and patterned to form gate electrodes 21. A silicon nitride film is so deposited as to cover the gate electrodes 21 and substrate 20 and left behind only on the side surfaces of the electrodes 21 by etch back, thereby forming spacers 22.

In addition, a silicon nitride film 23 is so formed as to cover the gate electrodes 21, spacers 22, and semiconductor substrate 20. The formation of this silicon nitride film 23 is done by low-pressure CVD at a film formation temperature of 350 to 600° C. and, preferably, 450° C., by using HCD gas, i.e., $SinCl(2n+2-x)Hx$ (n is an integer of 2 or more, and x is an integer of 0 to 2n+1) and ammonia ($NH_3$) as materials. When film formation is performed at this low temperature, the density of the silicon nitride film can be decreased to 2.2 g/cm$^3$ or less.

The nitrogen/silicon ratio of this silicon nitride film 23 is 1.2 or less. When HCD gas is used, the concentration of chlorine contained in the silicon nitride film 23 is 1.0E21 to 1.0E22 atoms/cm$^3$ because of chlorine contained in the gas. Also, this silicon nitride film 23 has a low film density, so its surface is readily oxidized. Hence, the oxygen concentration is 1.0E21 atoms/cm$^3$ or more from the film surface to a depth of 1 to 3 nm.

Figure 2:
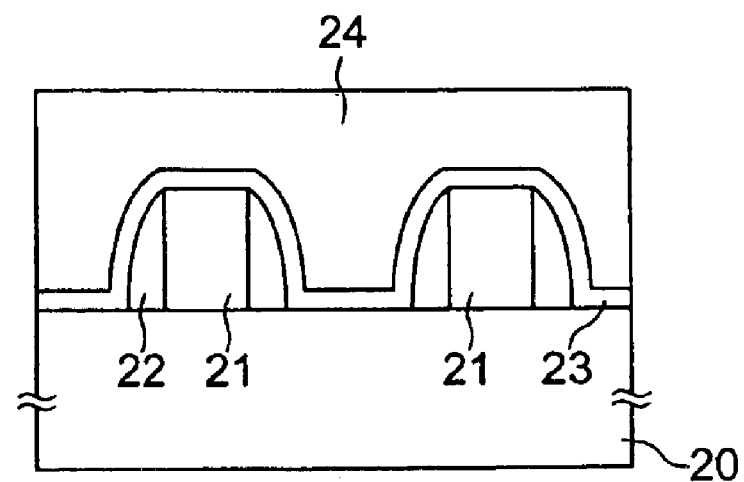
FIG. 2 is a longitudinal sectional view showing the longitudinal section of the semiconductor device according to the first embodiment of the present invention, and showing one step in the method of fabricating the semiconductor device.

To cover the obtained low-density silicon nitride film 23, a silicon oxide film 24 is deposited as a dielectric interlayer as shown in FIG. 2 in an $O_3$/TEOS ambient atmosphere under conditions by which flowability is obtained. That is, the film formation temperature is 500° C. or less and, preferably, 400 to 480° C., the film formation pressure is 200 to 760 Torr, and the $O_3$ concentration is 5 wt % or more.

Since the silicon nitride film 23 is formed as a low-density film, the underlayer dependence of the silicon oxide film 24 disappears. Accordingly, the formation of voids in the silicon oxide film 24 is prevented without losing the flowability unique to the $O_3$/TEOS process or deteriorating the filling performance.

In this embodiment as explained above, on a silicon nitride film having a low film density, a silicon oxide film is formed in an $O_3$/TEOS ambient atmosphere at a temperature of 500° C. or less. Consequently, the underlayer dependence disappears, and good filling characteristics can be obtained.

(2) Second Embodiment

The second embodiment of the present invention will be described below with reference to FIGS. 3 to 7. This embodiment relates to a device in which a silicon oxide film is formed to fill a trench formed in the STI step.

Figure 3:
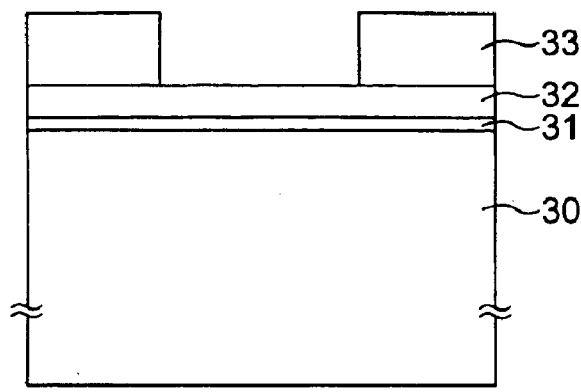
FIG. 3 is a longitudinal sectional view showing the longitudinal section of a semiconductor device according to the second embodiment of the present invention, and showing one step in a method of fabricating the semiconductor device.

As shown in FIG. 3, a silicon oxide film 31 is formed on the surface of a semiconductor substrate 30 by thermal oxidation, and a silicon nitride film 32 is formed on this silicon oxide film 31 by CVD. On this silicon nitride film 32, a resist film 33 from which a prospective trench portion is removed is formed.

Figure 4:
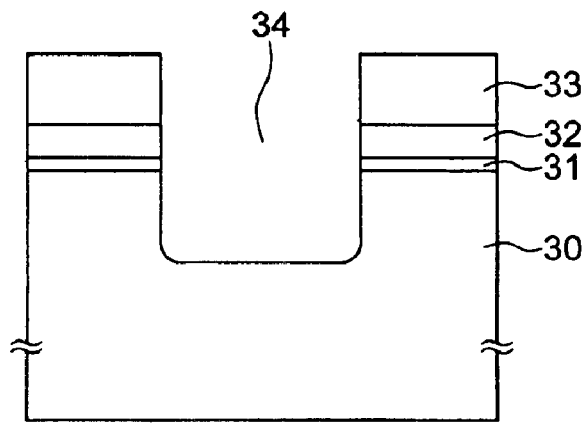
FIG. 4 is a longitudinal sectional view showing the longitudinal section of the semiconductor device according to the second embodiment of the present invention, and showing one step in the method of fabricating the semiconductor device.

As shown in FIG. 4, the resist film 33 is used as a mask to perform anisotropic etching, thereby forming a trench 34 in the surface of the semiconductor substrate 30. After that, the resist film 33 is removed.

Figure 5:
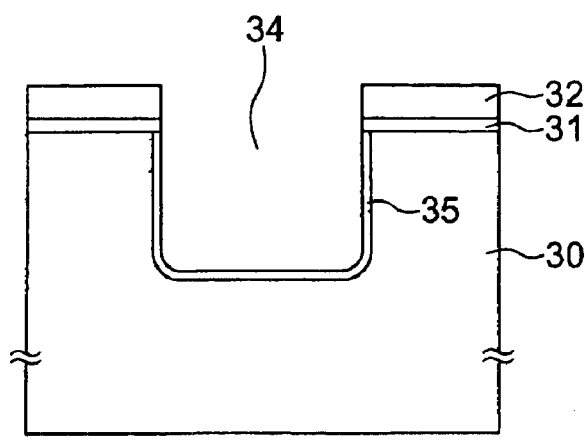
FIG. 5 is a longitudinal sectional view showing the longitudinal section of the semiconductor device according to the second embodiment of the present invention, and showing one step in the method of fabricating the semiconductor device.

As shown in FIG. 5, a silicon oxide film 35 is formed using thermal oxidation on the substrate surface exposed to the inner surfaces of the trench 34.

Figure 6:
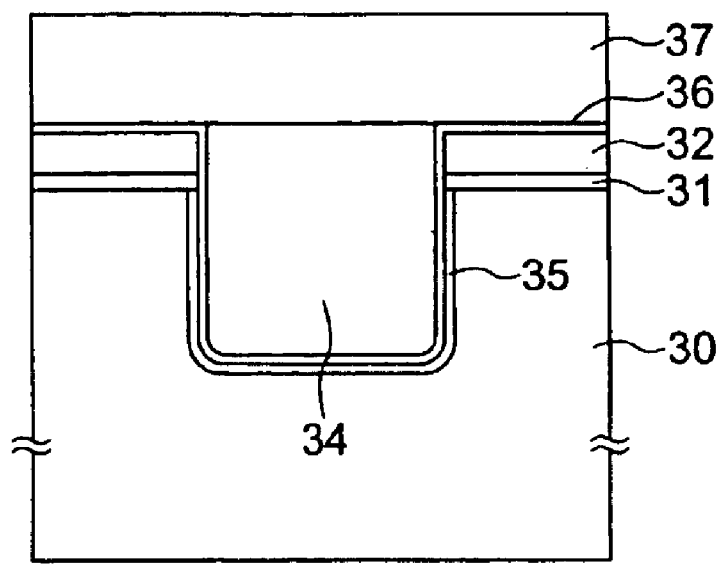
FIG. 6 is a longitudinal sectional view showing the longitudinal section of the semiconductor device according to the second embodiment of the present invention, and showing one step in the method of fabricating the semiconductor device.

As shown in FIG. 6, a silicon nitride film 36 is formed at a low density of 2.2 g/cm$^3$ so as to cover the entire surface including the inner surfaces of the trench 34. The film formation conditions are the same as in the first embodiment described above.

Figure 7:
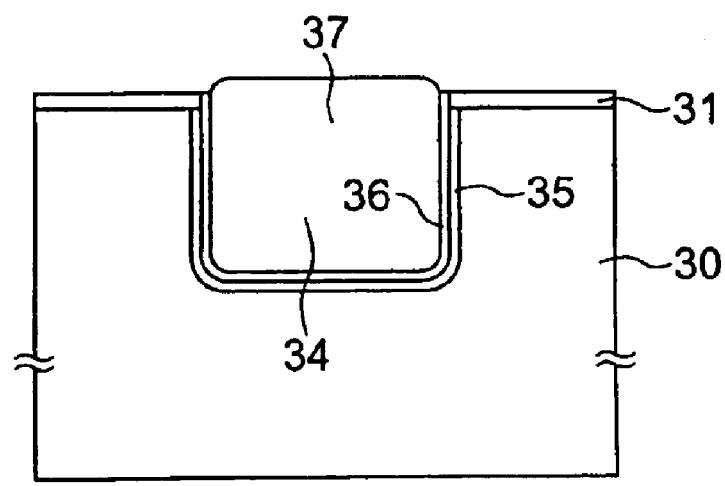
FIG. 7 is a longitudinal sectional view showing the longitudinal section of the semiconductor device according to the second embodiment of the present invention, and showing one step in the method of fabricating the semiconductor device.

On the surface of this silicon nitride film 36, a silicon oxide film 37 is deposited as an STI filling material under the same film formation conditions as in the first embodiment. After that, as shown in FIG. 7, CMP (Chemical Mechanical Polishing) and annealing for raising the density are performed. In addition, hot phosphoric acid is used to remove the silicon nitride films 32 and 36, thereby obtaining STI.

If a silicon oxide film is formed by O$_3$/TEOS directly on a silicon oxide film formed by thermal oxidation, a large underlayer dependence appears. In this embodiment, the silicon oxide film 37 is not directly formed in an O$_3$/TEOS ambient atmosphere on the silicon oxide film 35 formed by thermal oxidation. That is, the silicon nitride film 36 having a low film density is formed as a buffer layer. Consequently, the underlayer dependence of the silicon oxide film 37 disappears in the O$_3$/TEOS ambient atmosphere. Accordingly, the flowability unique to the O$_3$/TEOS process appears and the filling characteristics improve, so the trench 34 can be filled without forming any voids.

Although the silicon nitride film 36 remains inside the trench 34, the device characteristics are not adversely affected because the film is an insulating film.

In discussion of the underlayer dependence, the deposition rate ratio (=the growth rate of a silicon oxide film on a silicon nitride film/the growth rate of a silicon oxide film on a silicon substrate) is often used as an index. When the underlayer dependence exists, the film growth rate of a silicon oxide film on a silicon nitride film decreases, so the deposition rate ratio decreases.

Figure 8:
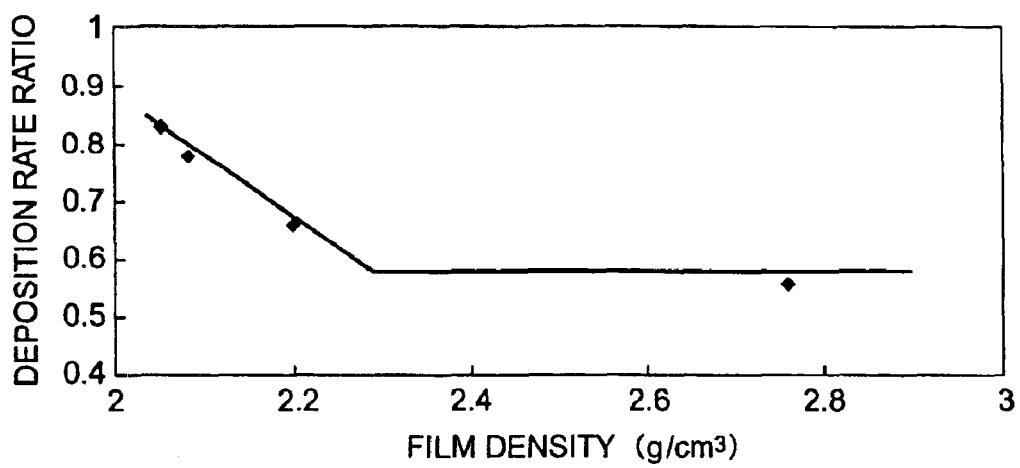
FIG. 8 is a graph showing the dependence of the deposition rate ratio of a silicon oxide film upon the density of an underlying silicon nitride film.

FIG. 8 shows the dependence of the deposition rate ratio upon the film density of a silicon nitride film. This graph shows that as the smaller the film density of the silicon nitride film, the larger the deposition rate ratio, and the smaller the underlayer dependence. This change in the deposition rate ratio increases after the film density of the silicon nitride film becomes 2.2 g/cm$^3$ or less. In the above embodiment, therefore, the film density of the silicon nitride film is set at 2.2 g/cm$^3$.

Figure 9:
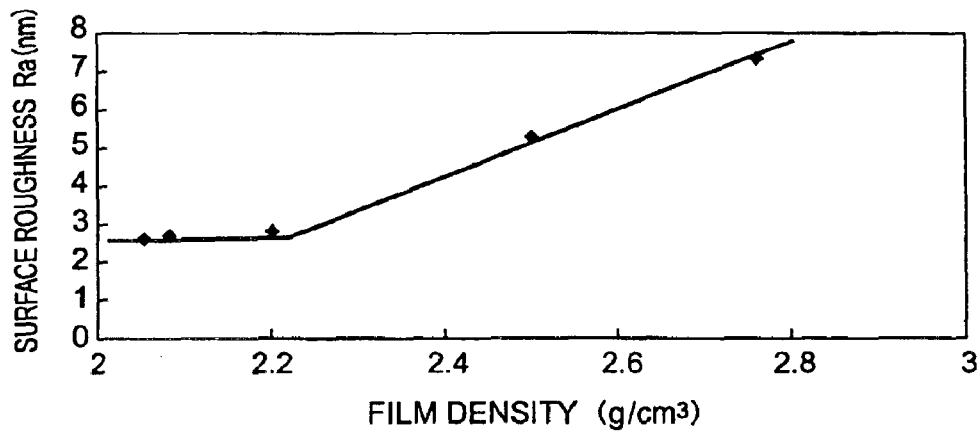
FIG. 9 is a graph showing the dependence of the surface roughness of a silicon oxide film upon the density of an underlying silicon nitride film.

FIG. 9 shows the dependence of the surface roughness of a silicon oxide film upon the film density of an underlying silicon nitride film in an O$_3$/TEOS ambient atmosphere.

As is apparent from this graph, when the film density of the silicon nitride film exceeds 2.2 g/cm$^3$, the underlayer dependence appears and abnormally grows the silicon oxide film, and the surface roughness of the silicon oxide film increases. Similar to the deposition rate ratio described above, this change in the surface roughness of the silicon oxide film also improves from a region in which the film density of the silicon nitride film is 2.2 g/cm$^3$ or less.

A silicon nitride film having a film density of 2.2 g/cm$^3$ or less is a low-quality porous film. Since this makes the film surface readily oxidizable, oxygen is contained at a concentration of about 1.0E21 from the film surface to a depth of 1 to 3 nm. The underlayer dependence is reduced probably because many adsorption sites of intermediate products exist in this porous silicon nitride film having a low film density.

As described above, this silicon nitride film is formed at a low temperature. A large amount of chlorine is entrapped into the film during the film formation, so the concentration of chlorine in the film is 1.0E21 to 1.0E22 atoms/cm$^3$.

Figure 10:
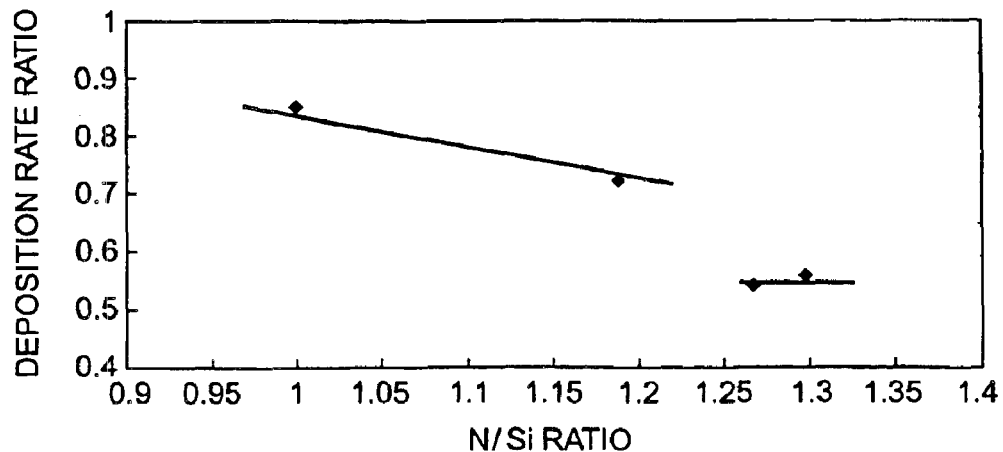
FIG. 10 is a graph showing the dependence of the deposition rate ratio of a silicon oxide film upon the N/Si composition ratio of an underlying silicon nitride film.
Figure 11:
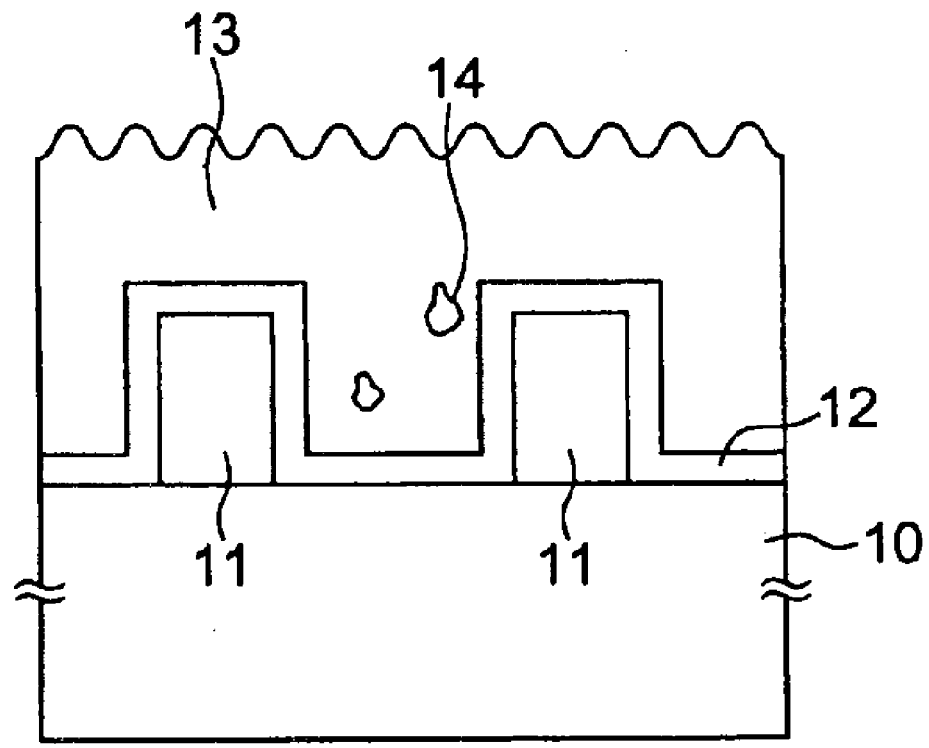
FIG. 11 is a longitudinal sectional view showing the longitudinal section of a conventional semiconductor device, and showing one step in a method of fabricating the semiconductor device.

FIG. 10 shows the relationship between the N/Si composition ratio of a silicon nitride film and the deposition rate ratio. This graph reveals that the more excess the silicon, the higher the deposition rate ratio, and the lower the underlayer dependence. The excess silicon on the film surface presumably forms a porous oxide film with oxygen in the atmosphere and produces many adsorption sites of intermediate products, thereby reducing the underlayer dependence. As shown in this graph, the deposition rate ratio increases in a region in which the N/Si ratio is 1.2 or less. A porous oxide film is probably formed on the surface of a silicon nitride film in this region.

By using this porous silicon nitride film as an underlayer, a silicon oxide film can be formed by O$_3$/TEOS having superior filling properties.

The above embodiments are merely examples and hence do not restrict the present invention. For example, in the above embodiments, HCD gas is used to allow the formation of a silicon nitride film at a low temperature. However, another gas such as BTBAS gas can also be used so that film formation at a low temperature is possible.

What is claimed is:

1. A semiconductor device fabrication method comprising:
   forming a silicon nitride film having a density of not more than 2.2 g/cm$^3$ on a semiconductor substrate; and
   forming a silicon oxide film on the silicon nitride film at a film formation temperature of not more than 500° C. and a film formation pressure of 200 to 760 Torr in an ambient atmosphere which contains TEOS and O$_3$ and in which the concentration of O$_3$ is not less than 5 wt %, and wherein the concentration of oxygen contained in the silicon nitride film after formation of the silicon oxide film is not less than 1.0E21 atoms/cm$^3$ from a surface of the silicon nitride film to a depth of 1 to 3 nm.

2. The method according to claim 1, wherein the silicon nitride film is formed by low-pressure CVD by using SinCl(2n+2−x)Hx (n is an integer of not less than 2, and x is an integer of 0 to 2n+1) as a material.

3. The method according to claim 1, wherein when the silicon nitride film is formed, the density of the silicon nitride film is set to not more than 2.2 g/cm$^3$ by setting the film formation temperature at 350 to 600° C.

4. The method according to claim 1, wherein when the silicon nitride film is formed, the nitrogen/silicon ratio is set to not more than 1.2 by setting the film formation temperature at 350 to 600° C.

5. A semiconductor device fabrication method comprising:
   forming a gate electrode on a semiconductor substrate;
   forming a silicon nitride film having a density of not more than 2.2 g/cm$^3$ so as to cover the gate electrode; and
   forming a silicon oxide film on the silicon nitride film at a film formation temperature of not more than 500° C. and a film formation pressure of 200 to 760 Torr in an ambient atmosphere which contains TEOS and O$_3$ and in which the concentration of O$_3$ is not less than 5 wt %, and wherein the concentration of oxygen contained in the silicon nitride film after formation of the silicon oxide film is not less than 1.0E21 atoms/cm$^3$ from a surface of the silicon nitride film to a depth of 1 to 3 nm.

6. The method according to claim 5, wherein the silicon nitride film is formed by low-pressure CVD by using SinCl(2n+2−x)Hx (n is an integer of not less than 2, and x is an integer of 0 to 2n+1) as a material.

7. The method according to claim 5, wherein when the silicon nitride film is formed, the density of the silicon nitride film is set to not more than 2.2 g/cm$^3$ by setting the film formation temperature at 350 to 600° C.

8. The method according to claim 5, wherein when the silicon nitride film is formed, the nitrogen/silicon ratio is set to not more than 1.2 by setting the film formation temperature at 350 to 600° C.

9. A semiconductor device fabrication method comprising:
   forming a trench in the surface of a semiconductor substrate;

forming a silicon nitride film having a density of not more than 2.2 g/cm$^3$ so as to cover the inner surfaces of the trench; and forming a silicon oxide film on the silicon nitride film at a film formation temperature of not more than 500° C. and a film formation pressure of 200 to 760 Torr in an ambient atmosphere which contains TEOS and O$_3$ and in which the concentration of O$_3$ is not less than 5 wt %, and wherein the concentration of oxygen contained in the silicon nitride film after formation of the silicon oxide film is not less than 1.0E21 atoms/cm$^3$ from a surface of the silicon nitride film to a depth of 1 to 3 nm.

10. The method according to claim 9, wherein the silicon nitride film is formed by low-pressure CVD by using SinCl(2n+2−x)Hx (n is an integer of not less than 2, and x is an integer of 0 to 2n+1) as a material.

11. The method according to claim 9, wherein when the silicon nitride film is formed, the density of the silicon nitride film is set to not more than 2.2 g/cm$^3$ by setting the film formation temperature at 350 to 600° C.

12. The method according to claim 9, wherein when the silicon nitride film is formed, the nitrogen/silicon ratio is set to not more than 1.2 by setting the film formation temperature at 350 to 600° C.

* * * * *